United States Patent
Disegni

(10) Patent No.: US 10,811,093 B2
(45) Date of Patent: Oct. 20, 2020

(54) METHOD OF REAL-TIME ACCESS TO A DIFFERENTIAL MEMORY, DIFFERENTIAL MEMORY AND ELECTRONIC SYSTEM

(71) Applicant: STMicroelectronics S.r.l., Agrate Brianza (IT)

(72) Inventor: Fabio Enrico Carlo Disegni, Spino d'adda (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/225,492

(22) Filed: Dec. 19, 2018

(65) Prior Publication Data

US 2019/0214083 A1    Jul. 11, 2019

(30) Foreign Application Priority Data

Jan. 5, 2018  (IT) .................. 102018000000581

(51) Int. Cl.
    *G11C 13/00*    (2006.01)
    *G06F 13/16*    (2006.01)
    *G11C 7/22*     (2006.01)

(52) U.S. Cl.
    CPC ...... *G11C 13/0033* (2013.01); *G06F 13/1636* (2013.01); *G11C 7/22* (2013.01); *G11C 13/0004* (2013.01); *G11C 13/004* (2013.01); *G11C 13/0069* (2013.01)

(58) Field of Classification Search
    None
    See application file for complete search history.

(56) References Cited

U.S. PATENT DOCUMENTS

| 4,292,676 A | * | 9/1981 | Henig ................... G11C 11/406 |
| | | | 365/222 |
| 5,950,224 A | | 9/1999 | Devin |
| 6,151,236 A | * | 11/2000 | Bondurant ........... G11C 7/1072 |
| | | | 365/203 |
| 2008/0043512 A1 | | 2/2008 | Fukushi |
| 2008/0170431 A1 | | 7/2008 | Sheu et al. |
| 2015/0339069 A1 | | 11/2015 | Nishikubo et al. |
| 2016/0358640 A1 | * | 12/2016 | Brederlow ................ G06F 8/65 |
| 2018/0166131 A1 | * | 6/2018 | Chen ..................... G11C 11/419 |

FOREIGN PATENT DOCUMENTS

| DE | 102016214879 A1 | 2/2018 |
| WO | 2008058101 A1 | 5/2008 |
| WO | 2016196835 A1 | 12/2016 |

\* cited by examiner

*Primary Examiner* — Douglas King
(74) *Attorney, Agent, or Firm* — Slater Matsil, LLP

(57) ABSTRACT

In an embodiment, a method of accessing logic data stored in a differential memory using single-ended mode includes: storing second logic data in an auxiliary memory module of the differential memory by copying first logic data stored in a first main memory module of the differential memory into the auxiliary memory module; refreshing the first logic data; receiving a request for reading the first logic data; when refreshing the first logic data, fetching the second logic data when refreshing the first logic data in response to the request for reading the first logic data; and when not refreshing the first logic data, fetching the first logic data in response to the request for reading the first logic data.

21 Claims, 9 Drawing Sheets

METHOD OF REAL-TIME ACCESS TO A DIFFERENTIAL MEMORY, DIFFERENTIAL MEMORY AND ELECTRONIC SYSTEM

CROSS-REFERENCE TO RELATED APPLICATIONS

This application claims the benefit of Italian Application No. 102018000000581, filed on Jan. 5, 2018, which application is hereby incorporated herein by reference.

This application is filed concurrently with U.S. patent application Ser. No. 16/225,557, filed Dec. 19, 2018, which claims the benefit of Italian Application No. 102018000000580, filed on Jan. 5, 2018, which applications are hereby incorporated herein by reference.

TECHNICAL FIELD

The present invention relates generally to an electronic system and method, and, in particular embodiments, to a method of real-time access to a differential memory, differential memory and electronic system.

BACKGROUND

As is known, nonvolatile phase-change memories (PCMs) represent a generation of integrated memories where storage of information is obtained by exploiting phase-change materials, which have the property of being able to switch between phases that have electrical resistivities of considerably different value. In particular, these materials may switch between an amorphous phase, with high resistivity, and a crystalline or polycrystalline phase, with low resistivity. Consequently, in a phase-change memory cell it is possible to associate a different value of a datum stored in the cell to a respective phase of a memory element of the cell.

For instance, it is possible to use elements of group VI of the periodic table, such as tellurium (Te), selenium (Se), or antimony (Sb), which are referred to as "chalcogenides" or "chalcogenic materials" to form phase-change memory elements. In particular, an alloy made up of germanium (Ge), antimony (Sb), and tellurium (Te), known as GST (having chemical composition $Ge_2Sb_2Te_5$) currently finds wide use in such memory elements.

Phase switching in a memory element may be obtained by locally increasing the temperature of the region of chalcogenic material, for example by causing passage of a programming electric current through resistive electrodes (generally known as "heaters") arranged in contact with the region of chalcogenic material. The electric current, by the Joule effect, generates the temperature profile necessary for phase change. In particular, when the chalcogenic material is in the amorphous state, with high resistivity (the so-called RESET state), it is necessary to apply a first current pulse (the so-called SET pulse) of a duration and amplitude such as to enable the chalcogenic material to cool slowly. Subjected to this treatment, the chalcogenic material changes state and switches from the high-resistivity state to a low-resistivity crystalline state (the so-called SET state). Conversely, when the chalcogenic material is in the SET state, it is necessary to apply a second current pulse (the so-called RESET pulse) of large amplitude and short duration so as to cause the chalcogenic material to return into the high-resistivity amorphous state.

In PCM circuits of a known type, reading of the datum stored in a memory cell may be carried out by applying to the memory element of chalcogenic material a voltage sufficiently low as not to cause a sensible heating thereof, and then by reading the value of the current flowing in the memory cell. Given that the current is proportional to the conductivity of the chalcogenic material, it is possible to determine in which phase the material is, and thus arrive at the datum stored in the memory cell.

In a known way, PCMs of a differential type are typically designed according to a scheme with an array of memory cells arranged in rows (word lines) and columns (bit lines). Each memory cell is provided by a phase-change storage element and by a selector transistor, connected in series. A column decoder and a row decoder enable, on the basis of address logic signals received at input and more or less complex decoding schemes, selection of the memory cells, and in particular of the corresponding word lines and bit lines, each time addressed.

The column decoder comprises a plurality of analog selection switches (implemented with transistors), which receive on their respective control terminals the address signals. The selection switches are arranged according to a tree structure in hierarchical levels, and their number in each hierarchical level is linked to the arrangement and size of the memory array. The selection switches, once enabled, make it possible to bring the bit line selected to a definite value of voltage and/or current, according to the operations that are to be implemented. In particular, a current path is created between a programming stage or a reading stage and the bit line selected. The current path is defined by the series of a certain number of selection switches.

In a known way, sense amplifiers carry out reading of the data stored in the memory cells, comparing the current that flows in the memory cell selected (or an electrical quantity correlated thereto) with a reference current supplied by a reference-current generator (single-ended reading) and/or by one or more reference cells, used for the entire memory array. Single-ended reading is typically used during verification that programming of the cell has occurred or during testing. During normal use of the memory, reading of a double-ended (differential) type is instead adopted, where the sense amplifiers compare the current flowing in the memory cell selected with the current flowing in a respective cell associated to the memory cell selected in the differential architecture.

To carry out single-ended reading, one input of the sense amplifier receives the current of the memory cell that is to be read, whereas the other input of the sense amplifier receives the reference current supplied by the reference-current generator.

Reading architectures for PCMs of a differential type afford advantages in terms of reliability in so far as the datum is stored in a redundant way and further they do not require generation of a reference current, in so far as reading is carried out by simply comparing the respective currents that flow in the cells associated to a same bit.

In single-ended mode, it is possible to read and write independently two memory cells that are normally associated for carrying out differential reading. In effect, when it is operated in single-ended mode, each memory cell may have a value independent of the value of the other memory cells, and it is consequently possible to double the amount of data that may be stored in the PCM.

A drawback of the PCM devices used in single-ended mode lies in the fact that in single ended mode the degradation over time of the logic data stored may not be compensated and, in the absence of periodic refresh operations, the associated information is lost. Instead, when PCMs are used in double-ended mode, all the logic data undergo in time common-mode degradation and, consequently, via differential reading, it is in any case possible to arrive at the desired information content, cancelling out the offset due to common-mode degradation.

In order to prevent any loss of data in a memory cell, albeit continuing to use the single-ended mode, it is expedient to refresh the memory cell periodically. Refresh methods are known for architectures based upon fast-writing technology, such as the dynamic random-access memory (DRAM), where the time necessary for each writing operation is of the order of nanoseconds. In these methods, the datum to be refreshed is read and overwritten periodically before it gets lost.

Conversely, in PCM technologies of a known type, the duration of a writing operation is in the region of several microseconds, typically 10 microseconds. Consequently, it would not be possible to update entire memory banks if used for applications that require real-time access to the memory (in reading and/or writing).

SUMMARY

Some embodiments provide a management method of real-time access to a differential memory operated in single-ended mode, a differential memory that may be operated in single-ended mode, and an electronic system including the differential memory that will be able to overcome the drawbacks of the prior art.

In some embodiments, the differential memory is a phase-change memory. In some embodiments, the differential memory may be operated in single-ended mode, i.e., accessing twice the number of address spaces with respect to differential memories of conventional use.

According to an embodiment, a differential memory, such as a phase-change memory, includes a first main memory module, which stores first logic data to be refreshed, and an auxiliary memory module. In some embodiments, the differential memory is operated in single-ended mode. In some embodiments, the differential memory is operated by storing second logic data in the auxiliary memory module, copying the first logic data; refreshing the first logic data; and fetching, in response to a request for reading the first logic data, the second logic data during the step of refresh of the first logic data, and fetching the first logic data, otherwise.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
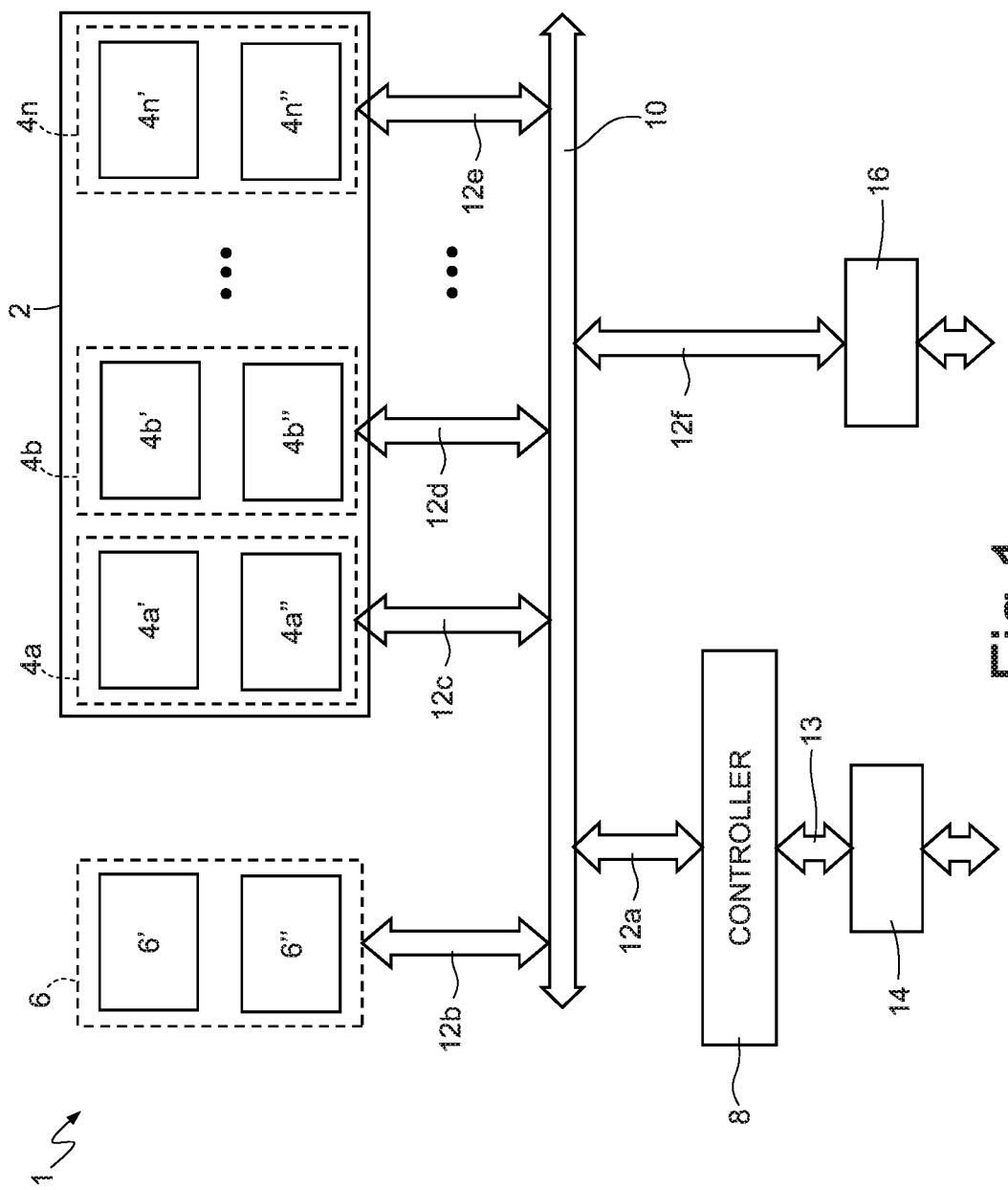
FIG. 1 is a schematic illustration of a portion of a nonvolatile memory device according to one embodiment of the present invention.

Represented schematically in FIG. 1 and designated as a whole by the reference number 1 is a portion of a memory device, in particular a nonvolatile memory. According to an embodiment of the present invention, the memory 1 is of a differential type, in particular of a PCM type. The nonvolatile-memory device 1 is shown limitedly to just the parts necessary for an understanding of the present disclosure.

In particular, the nonvolatile memory device 1 comprises a memory array 2, constituted by a plurality of "n" main memory modules $4a$-$4n$. Each main memory module $4a$-$4n$ comprises a first submodule $4a'$-$4n'$ and a second submodule $4a''$-$4n''$. In particular, each first submodule $4a'$-$4n'$ comprises a plurality of memory cells, and each second submodule $4a''$-$4n''$ comprises a plurality of respective memory cells.

In a per se known manner and not shown in FIG. 1, the plurality of first memory cells stores respective logic data of a binary type. The plurality of second memory cells corresponds, as regards number and manufacturing characteristics, to the plurality of first memory cells, and is configured to store respective logic data complementary to the logic data stored in the respective plurality of first memory cells so as to enable differential reading of the logic data.

In any case, each main memory module $4a$-$4n$ may be used, in addition to differential-mode, in single-ended mode, such that the logic data stored in the plurality of memory cells of each second submodule $4a''$-$4n''$ are not complementary to the logic data stored in the plurality of memory cells of the respective first submodule $4a'$-$4n'$, but are further information data. In this way, it is possible to double the total capacity of the memory array 2.

The nonvolatile-memory device 1 further comprises an auxiliary memory module 6. In particular, the auxiliary memory module 6 structurally and operatively corresponds to each main memory module $4a$-$4n$ and is thus formed by a first submodule 6' and a second submodule 6". In particular, the first submodule 6' comprises a plurality of memory cells, and the second submodule 6" comprises a plurality of respective memory cells, which may be addressed and thus may be used in single-ended mode.

In addition, the nonvolatile-memory device 1 comprises a controller 8, operatively coupled to the memory array 2 and to the auxiliary memory module 6. The controller 8 is configured to implement a method of reading and writing logic data in the memory array 2 and in the auxiliary memory module 6.

Furthermore, the nonvolatile-memory device 1 comprises a bus 10. The controller 8, the main memory modules $4a$-$4n$, and the auxiliary memory module 6 are each coupled to the bus 10 by respective communication lines $12a$-$12e$ so as to enable, as described in greater detail hereinafter, a transfer of data and control signals between the controller 8, the main memory modules $4a$-$4n$, and the auxiliary memory module 6.

Further, the nonvolatile-memory device 1 comprises a controller interface 14. The controller interface 14 is coupled to the controller 8 so as to send to the controller 8, via a communication line 13, logic data to be written in the memory array 2.

In addition, the nonvolatile-memory device 1 comprises a memory-array interface 16. The memory-array interface 16 is coupled to the bus 10 via a respective communication line $12f$. A user of the nonvolatile-memory device 1 may gain access, for example in reading, to the data stored in the nonvolatile-memory device 1 via the memory-array interface 16. The user is, for example, a microprocessor, a DSP, or a microcontroller.

Figure 2:
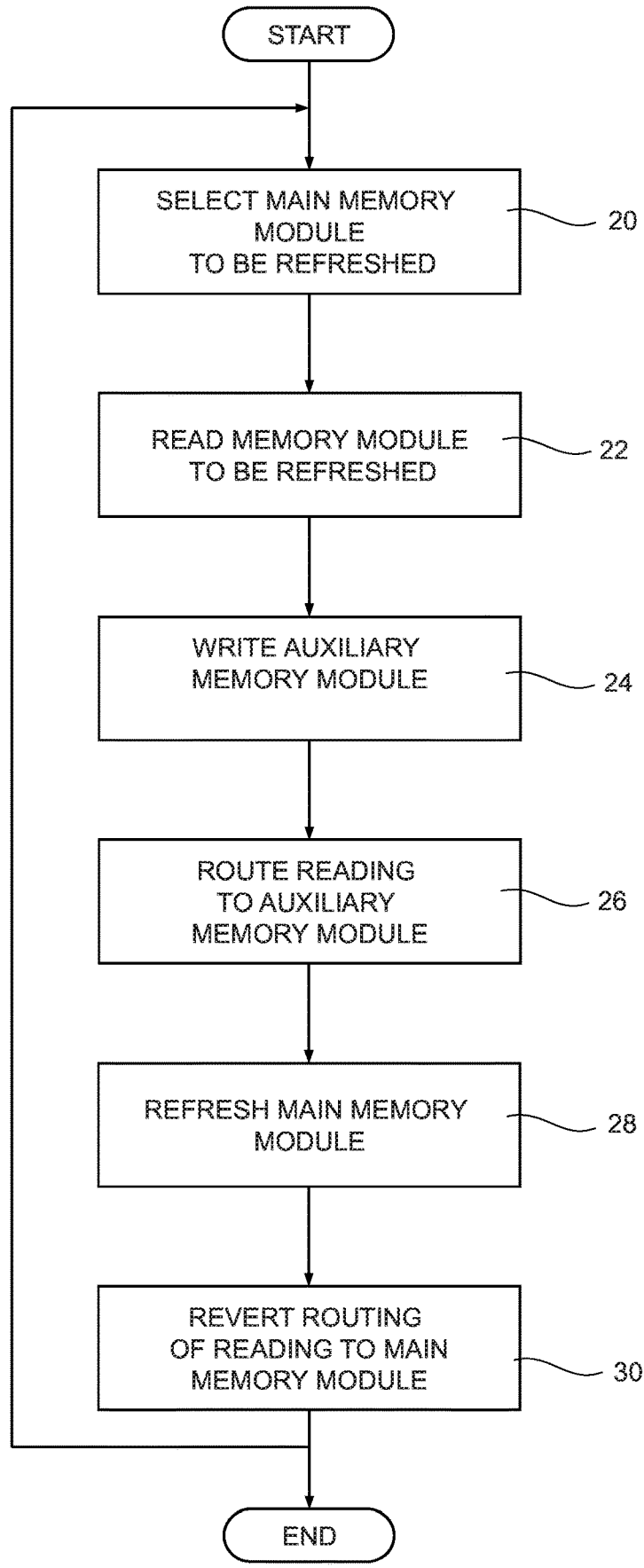
FIG. 2 shows schematically, by a block diagram, a method for refresh of the nonvolatile-memory device of FIG. 1.

FIG. 2 illustrates schematically, by a block diagram, a method of refresh of the memory array 2. The refresh method first of all comprises the step 20 of selection of a main memory module 4a-4n to be refreshed. By way of example, in the course of step 20 the main memory module 4a is selected.

Step 20 is followed by step 22, where the controller 8 reads the data contained in the main memory module 4a selected in step 20. In particular, step 22 is performed in a way transparent for the user of the nonvolatile-memory device 1, which may request reading operations by addressing any cell of any main memory module 4a-4n. In the case where the user requests access to the main memory module 4a simultaneously to step 22, there occurs a temporary conflict that has a negligible impact upon the reading times. In particular, when the user has access in reading to the main memory module 4a, a control signal READY assumes the logic value "0"; at the end of reading, the control signal READY assumes the logic value "1." The controller interface 14 has access to the control signal READY. If in the course of step 22 the value of the control signal READY is "0" (i.e., reading by the user is in progress), the controller interface 14 postpones the reading operation to the end of the reading operation of the user, and sets the control signal READY to the value "0" up until the end of its own reading operation. If, in the course of step 22, the value of the control signal READY is "1" (i.e., a reading access to the main memory module 4a by the user is not in progress), the controller interface 14 sets the control signal READY at the value "0" up until the end of its own reading operation so that the user may not gain access during the reading operation and thus conflicts are prevented. In any case, at the end of its own reading operation, the controller interface 14 sets the control signal READY to the logic value "1".

Step 22 is followed by step 24, where the controller 8 writes in the auxiliary memory module 6 the data read in step 22. In particular, the entire contents of the main memory module 4a are copied into the auxiliary memory module 6. For this purpose, it could be necessary to reiterate in a number of cycles the succession of steps 22 and 24 up to copying of the entire contents. Furthermore, in order to preserve the consistency of the data contained in the memory array 2, the controller 8 prevents in this step execution of operations of writing in the memory array 2.

Step 24 is followed by step 26, where requests by the user for reading the information content of the main memory module 4a are re-addressed to the auxiliary memory module 6.

Step 26 is followed by step 28, where the content of the main memory module 4a is physically refreshed, i.e., its content is read and overwritten. According to an aspect of the present invention, during step 28 the user may access the auxiliary memory module 6 in order to read the content thereof, which, as has been said, corresponds to the information content of the main memory module 4a.

In this way, the user has an uninterrupted access to the information content of the entire memory array 2, enabling use thereof for real-time applications.

Step 28 is followed by step 30, where requests for reading the contents of the main memory module 4a, previously re-addressed to the auxiliary memory module 6 in step 26, are again addressed to the main memory module 4a.

Following upon step 30, it is possible to return to step 20 in order to select a new main memory module 4a-4n to be refreshed. For instance, the controller 8 may select periodically and in a sequential way each main memory module 4a-4n according to pre-set time intervals. In particular, these time intervals have a duration compatible with the retention time of each memory cell of the nonvolatile-memory device 1 so as to enable an uninterrupted use of the single-ended mode of the memory array 2. In particular, the retention time of a memory cell is the duration that elapses between writing of a logic datum in the cell and the instant when the datum is no longer readable in so far as it is excessively degraded.

Figure 3:
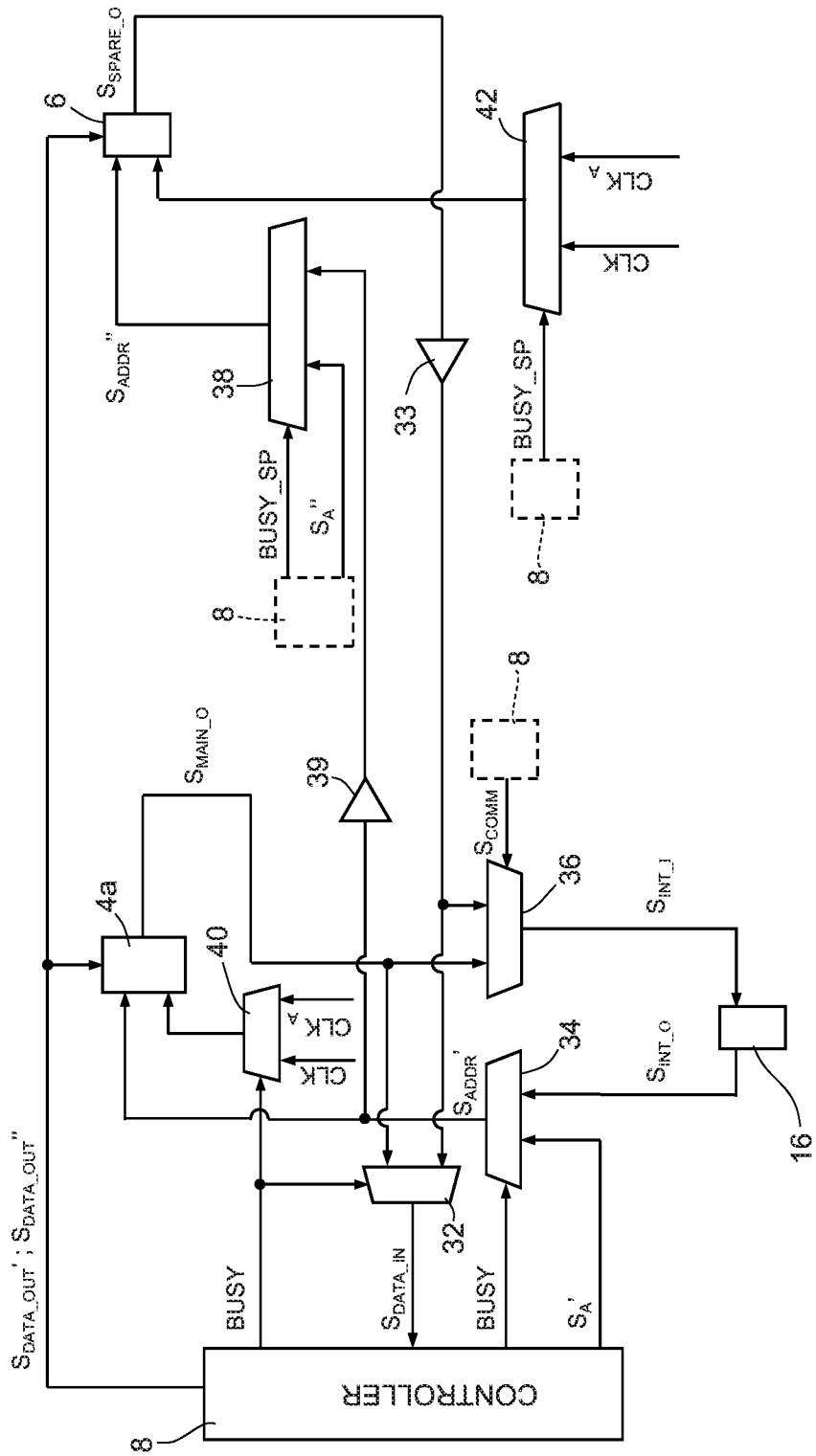
FIG. 3 shows an electrical circuit corresponding to a portion of the nonvolatile-memory device of FIG. 1, included in the portion of FIG. 1.

FIG. 3 shows in greater detail a portion of the nonvolatile-memory device 1 of FIG. 1, comprising the main memory module 4a, the auxiliary memory module 6, the controller 8, and the memory-array interface 16. In particular, the nonvolatile-memory device 1 further comprises a plurality of multiplexers designed to render transparent the refresh operation for the user of the nonvolatile-memory device 1.

The controller 8 is further configured to generate a first control signal BUSY, a second control signal BUSY_SP, and a third control signal SCOMM for controlling the plurality of multiplexers described more fully hereinafter.

The controller 8 is further configured to receive data contained in the main memory module 4a and in the auxiliary memory module 6 via an input signal SDATA_IN. In particular, the signal SDATA_IN is one of the signals SMAIN_O (which carries the data contained in the main memory module 4a) and SSPARE_O (which carries the data contained in the auxiliary memory module 6) that are selected via a multiplexer 32 controlled by the first control signal BUSY. For this purpose, the multiplexer 32 is coupled to the main memory module 4a and to the auxiliary memory module 6 for receiving, respectively, the signal SMAIN_O and the signal SSPARE_O. For instance, the signal SSPARE_O is read following upon an operation of writing of the auxiliary memory module 6, in order to verify that the writing operation has been carried out correctly. Otherwise, according to known procedures, subsequent writing operations are carried out.

In particular, the multiplexer 32 is coupled to the auxiliary memory module 6 via interposition of a first buffer 33 so as to reduce the propagation times associated to the auxiliary memory module 6.

The controller 8 is further configured to: send to the main memory module 4a an output signal SDATA_OUT' that carries data read from the main memory module 4a so as to implement step 28 of the method of FIG. 2; and send to the auxiliary memory module 6 an output signal SDATA_OUT". which carries data read from the main memory module 4a so as to implement step 24 of the method of FIG. 2.

The controller 8 is further configured to generate a signal SA', which contains an address of one of the memory cells of the main memory module 4a. The signal SA' is supplied to an input of a multiplexer 34 controlled by the first control signal BUSY. The multiplexer 34 further receives a signal SINT_O from the memory-array interface 16, which contains an address for carrying out a writing operation of a conventional type of one of the memory cells of the main memory module 4a. The first control signal BUSY enables selection of one of the input signals SA', SINT_O in order to generate a signal SADDR' at output from the multiplexer 34, according to whether it is executing the refresh method of FIG. 2 or a writing operation of a conventional type.

The signal SADDR' is supplied to the main memory module 4a for addressing one of the memory cells of the main memory module 4a so as to implement one of steps 24 and 28 of the refresh method of FIG. 2.

Consequently, the signal SMAIN_O at output from the main memory module 4a contains data corresponding to the data contained in the memory cell of the main memory module 4a addressed by the signal SADDR'.

The signal SMAIN_O is further supplied to a multiplexer 36 controlled by the third control signal SCOMM. The multiplexer 38 further receives at input the signal SSPARE_O from the auxiliary memory module 6 via interposition of the first buffer 33. The multiplexer 38 selects one of the signals SMAIN_O, SSPARE_O to generate a signal SINT_I at input to the memory-array interface 16. The signal SINT_I consequently contains data sent in response to reading requests from the user. These data come from the main memory module 4a or, during a refresh thereof, from the auxiliary memory module 6.

The controller 8 is further configured to generate a signal SA", containing an address of one of the memory cells of the auxiliary memory module 6. The signal SA" is supplied to an input of a multiplexer 38 controlled by the second control signal BUSY_SP. The multiplexer 38 further receives at input the signal SADDR' via interposition of a second buffer 39 so as to reduce the propagation times associated to the auxiliary memory module 6. The second control signal BUSY_SP enables selection of one of the input signals SA", SADDR' in order to generate a signal SADDR" at output from the multiplexer 38. In particular, the output signal SADDR" corresponds to the input signal SA" in the course of copying of the data of the main memory module 4a into the auxiliary memory module 6 (step 24 of the refresh method of FIG. 2), and to the input signal SADDR'=SINT_O in the case where the user requests reading of the information content of the memory cell 4a in the course of refresh of the main memory module 4a (step 28 of the refresh method of FIG. 2).

The controller 8 is further configured to supply a multiplexer 40 with a clock signal CLK generated by a clock generator (not shown in FIG. 3). The multiplexer 40 further receives at input a clock signal CLKA (generated by another clock generator not shown in FIG. 3), which represents the standard operating clock of the main memory module 4a. The multiplexer 40 is controlled by the first control signal BUSY so as to generate an output signal used as clock of the main memory module 4a by selecting the signal CLK at output from the controller 8, during refresh of the main memory module 4a, and the signal CLKA, otherwise.

The clock signal CLK at output from the controller 8 is further supplied to a multiplexer 42 controlled by the second control signal BUSY_SP. The multiplexer 42 further receives at input the clock signal CLKA. The multiplexer 42 generates an output signal used as clock of the auxiliary module 6 by selecting the signal CLK, during copying of the data of the main memory module 4a into the auxiliary memory module 6 (step 24 of the refresh method of FIG. 2), and the signal CLKA, in the case where the user requests reading of the information content of the memory cell 4a during refresh of the main memory module 4a (step 28 of the refresh method of FIG. 2).

It is evident that the other main memory modules 4b-4n are structurally equivalent to the main memory module 4a of FIG. 3, and are operatively coupled to the controller 8, to the auxiliary memory module 6, and to the memory-array interface 16 via respective multiplexers. Furthermore, each main memory module 4a-4n may be associated to a respective clock signal, for example different from the clock signal of the other main memory modules. In other words, each main memory module 4a-4n may operate asynchronously with respect to the others, and send respective address signals and clock signals at input to the multiplexers 38 and 42, respectively.

In particular, each clock signal may have a frequency of its own different from the frequency of the other clock signals. Consequently, the auxiliary module 6 may be controlled for operating according to the synchronism of each clock signal and thus to the respective frequencies so as to replicate the operation of the main memory module during refresh.

In order to describe in greater detail some steps of the refresh method of FIG. 2, each of FIGS. 4A-4E shows the portion of the nonvolatile-memory device 1 of FIG. 3 during a different step of the method. In each of FIGS. 4A-4E, communication lines corresponding to signals that are active in the corresponding step of the method are highlighted with the use of thick lines, where by "active signals" are meant signals that carry data during the step, signals that carry addresses to the data, and clock signals designed to time the data transport.

Figure 4A:
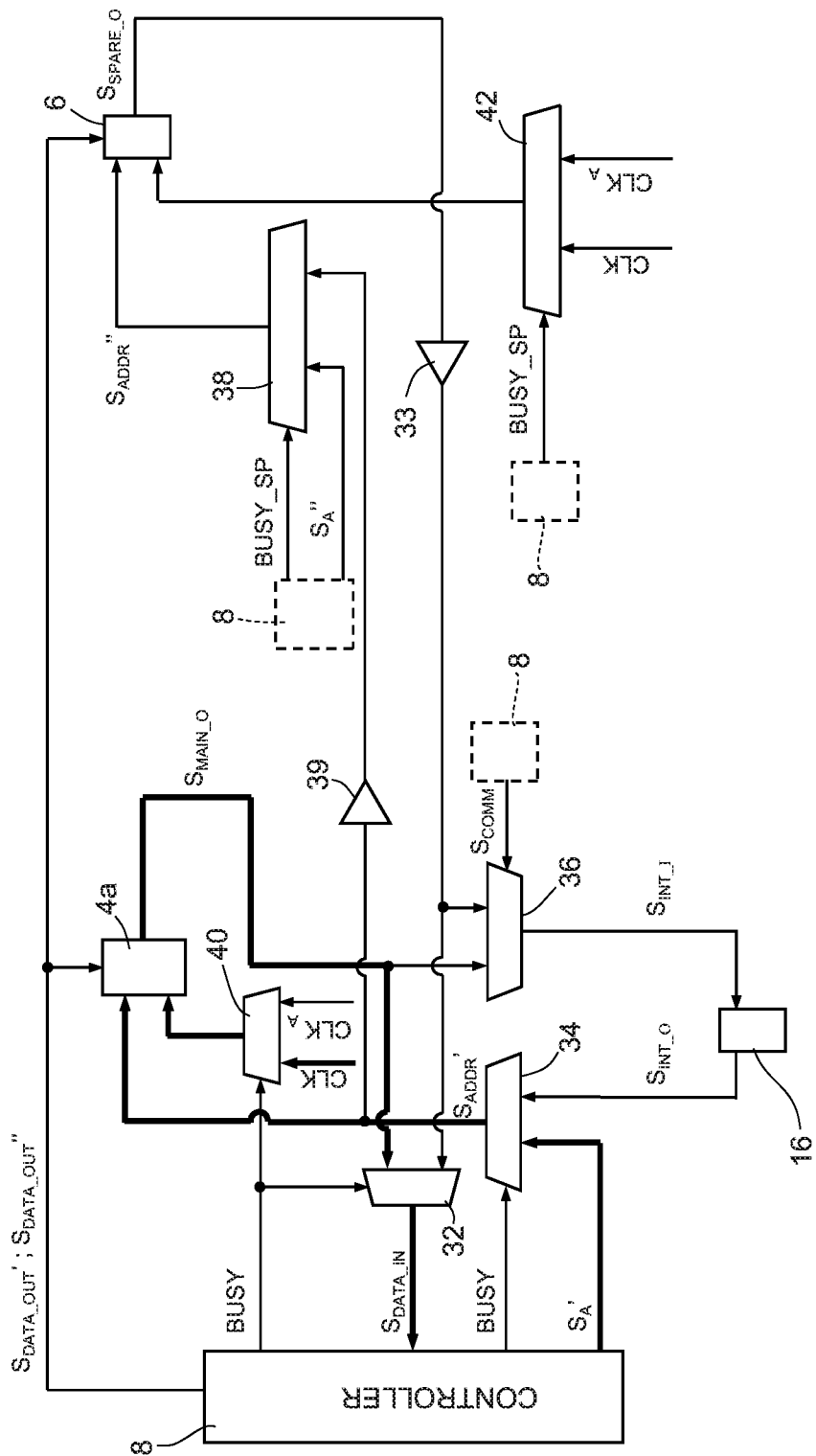
FIGS. 4A-4E show the circuit of FIG. 3 in respective steps of the method of FIG. 2, where circuit connections of particular importance for implementation of the respective step of the method are highlighted by thick lines.

In particular, FIG. 4A regards step 22 of the method, where the controller 8 reads the data contained in the main memory module 4a.

During Step 22, the controller 8 generates the first control signal BUSY so as to select the signals SMAIN_O, SA', and CLK, which are thus supplied at output by the respective multiplexers 32, 34, 40. In this way, the controller 8 receives at input the signal SDATA_IN, corresponding to the datum contained in the memory cell that is addressed by the signal SA' and is contained in the main memory module 4a. The controller 8 is configured to read in this way all the data contained in the main memory module 4a varying the address carried by the signal SA'.

Figure 4B:
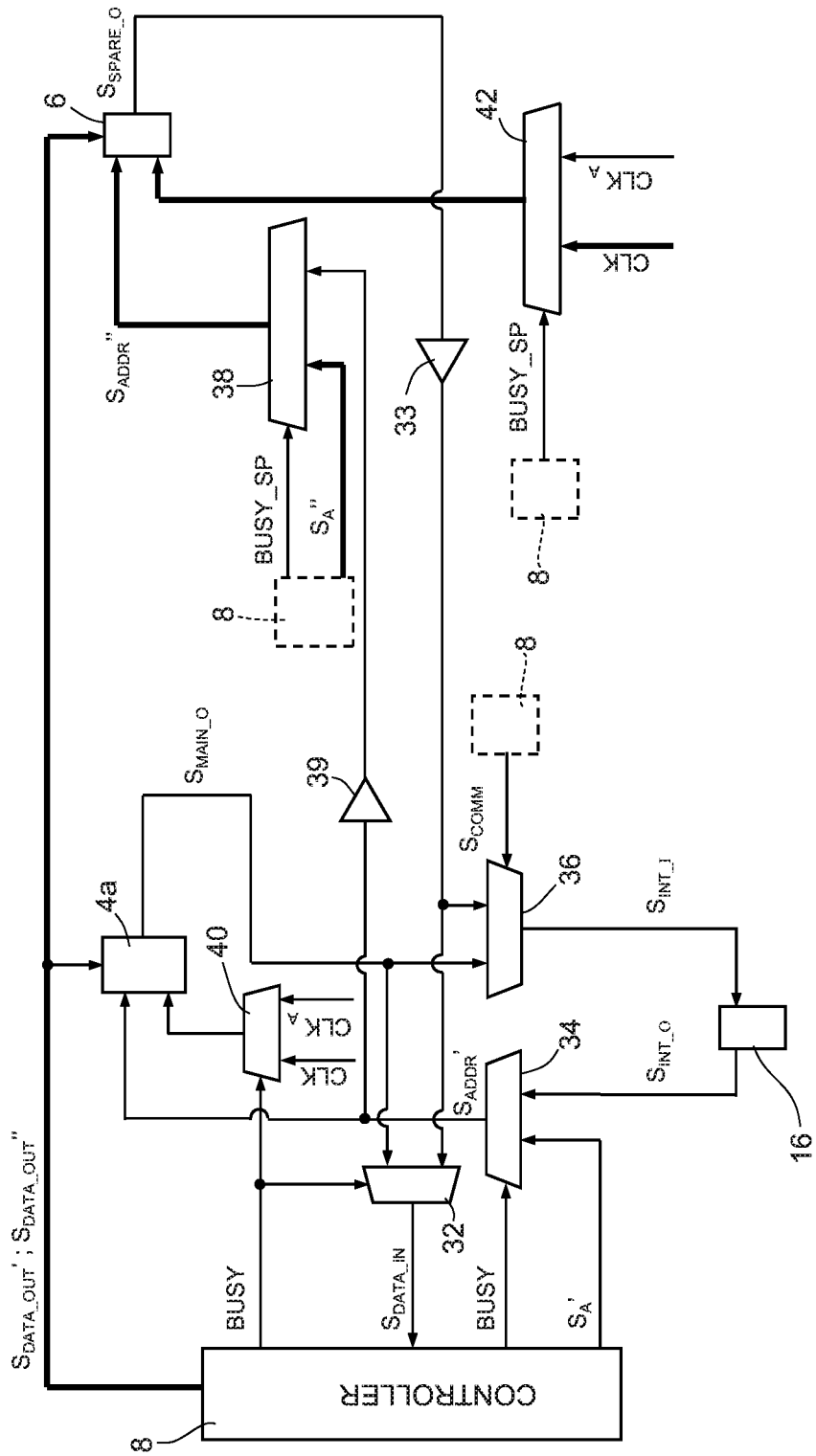

FIG. 4B regards step 24 of the method, where the controller 8 writes in the auxiliary memory module 6 the data read during step 22.

During step 24, the controller 8 generates the second control signal BUSY_SP so as to select the signals SA" and CLK, which are thus supplied at output by the respective multiplexers 38, 42. In addition, the controller 8 sends to the auxiliary memory module 6 the output signal SDATA_OUT", containing data to be written in the memory cell of the auxiliary memory module 6 addressed by the signal SADDR"=SA". The controller 8 is configured to write in this way all the data read previously (step 22) from the main memory module 4a, varying the address carried by the signal SA".

Figure 4C:
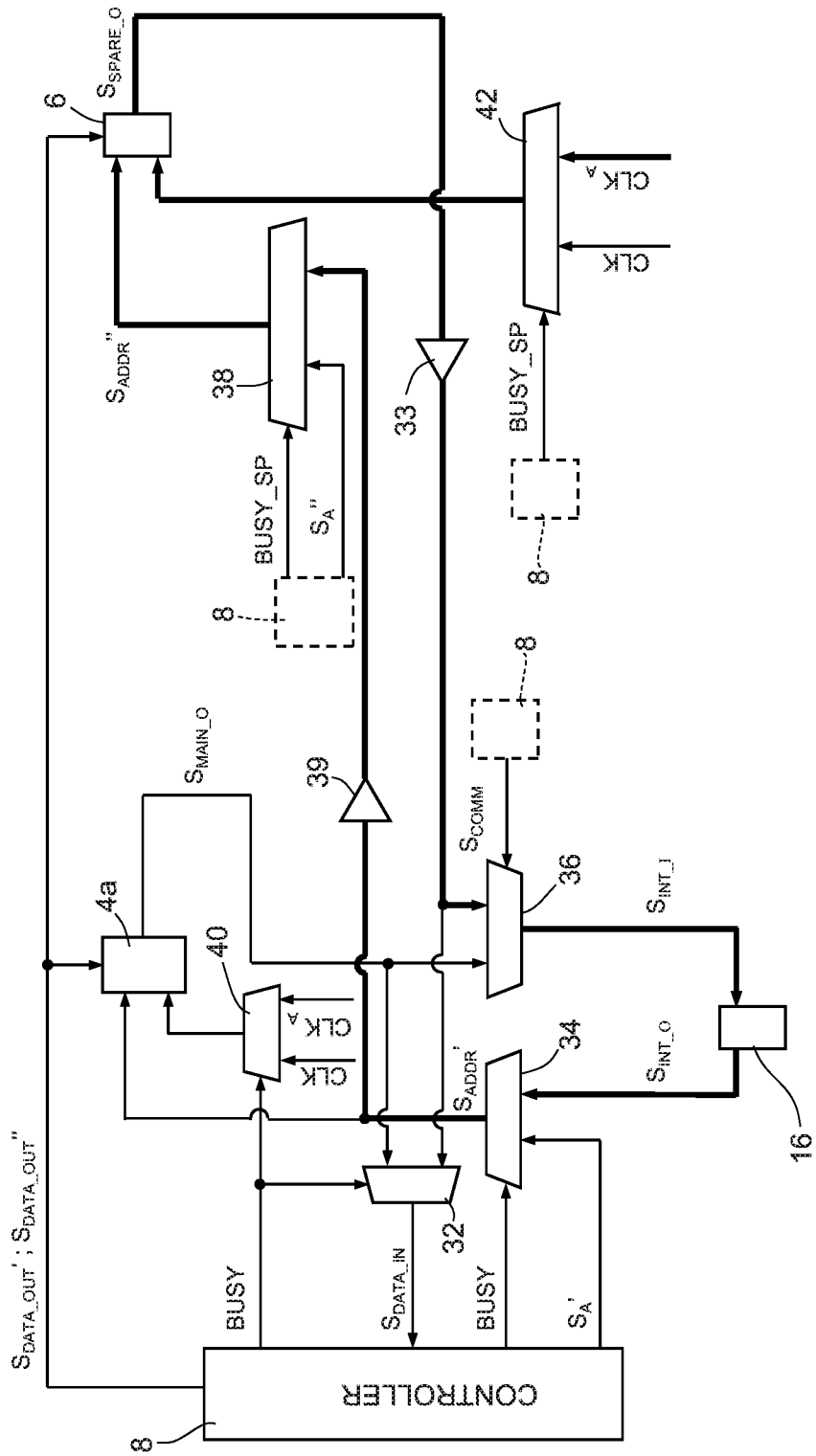

FIG. 4C regards step 26 of the method, and represents an operation of reading by the user of an information content of the main memory module 4a, re-addressed to the auxiliary memory module 6.

In the time interval that elapses from execution of step 26 to start of step 30, the controller 8 generates the second control signal BUSY_SP so as to select the signals SINT_O, SADDR' and CLKA, which are thus supplied at output by the respective multiplexers 34, 38, 42. Further, the controller 8 generates the third control signal SCOMM so as to select the signal SSPARE_O, supplied at output by the multiplexer 36. In this way, whenever in the time interval the user requests reading of the information content of the main memory module 4a associated to the memory cell addressed by the signal SINT_O, the datum contained in the memory cell of the auxiliary memory module 6 addressed by the signal SADDR"=SADDR'=SINT_O is read. The datum, supplied at output by the auxiliary memory module 6 via the signal SSPARE_O, is thus sent to the memory-array interface 16 via the signal SIN_I.

Figure 4D:
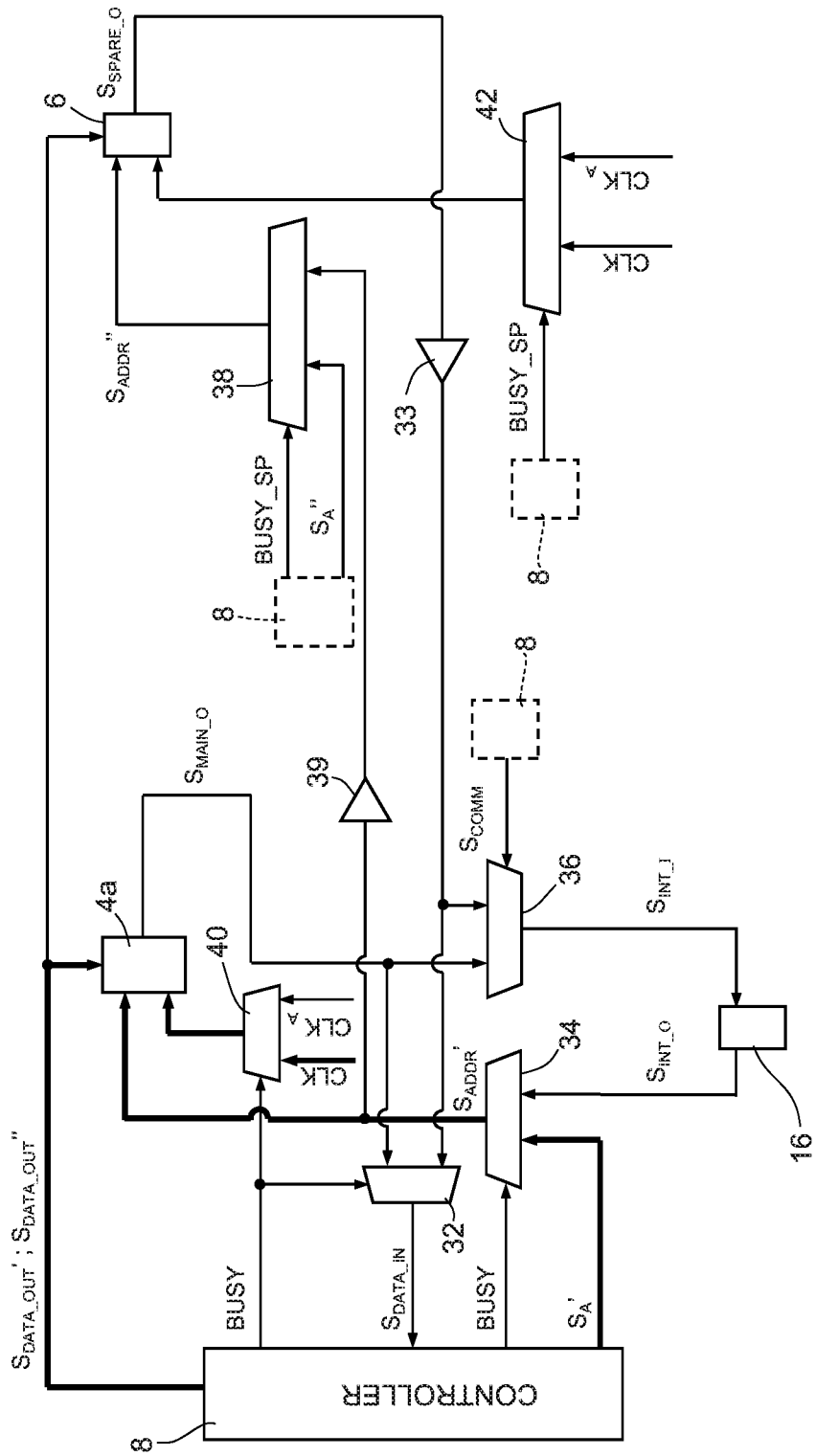

FIG. 4D regards step 28 of the method, where the content of the main memory module 4a is refreshed.

In the course of step 28, in a first sub-step (not illustrated graphically in FIG. 4D), the controller 8 reads the datum of the memory cell of the main memory module 4a addressed by the signal SADDR'=SA'. For this purpose, as already shown in FIG. 4A for step 22, the controller 8 generates the first control signal BUSY so as to select the signals SMAIN_O, SA', and CLK, which are thus supplied at output by the respective multiplexers 32, 34, 40.

Following upon reception by the controller 8 of the datum read and carried by the signal SDATA_IN, a second sub-step of step 28, shown in FIG. 4D, is carried out, where the controller 8 continues to generate the first control signal BUSY as in the first sub-step, and further sends to the main memory module 4a the output signal SDATA_OUT', containing the datum that is read in the first sub-step and is to be physically refreshed via overwriting.

The controller 8 is configured to repeat the first and second sub-steps for each datum contained in the main memory module 4a. In particular, it is possible to carry out in a first time interval the first sub-step for each datum and in a second time interval the second sub-step. Alternatively, it is possible to carry out the second sub-step for one datum immediately after the first sub-step for the same datum, and then pass to the next datum.

Figure 4E:
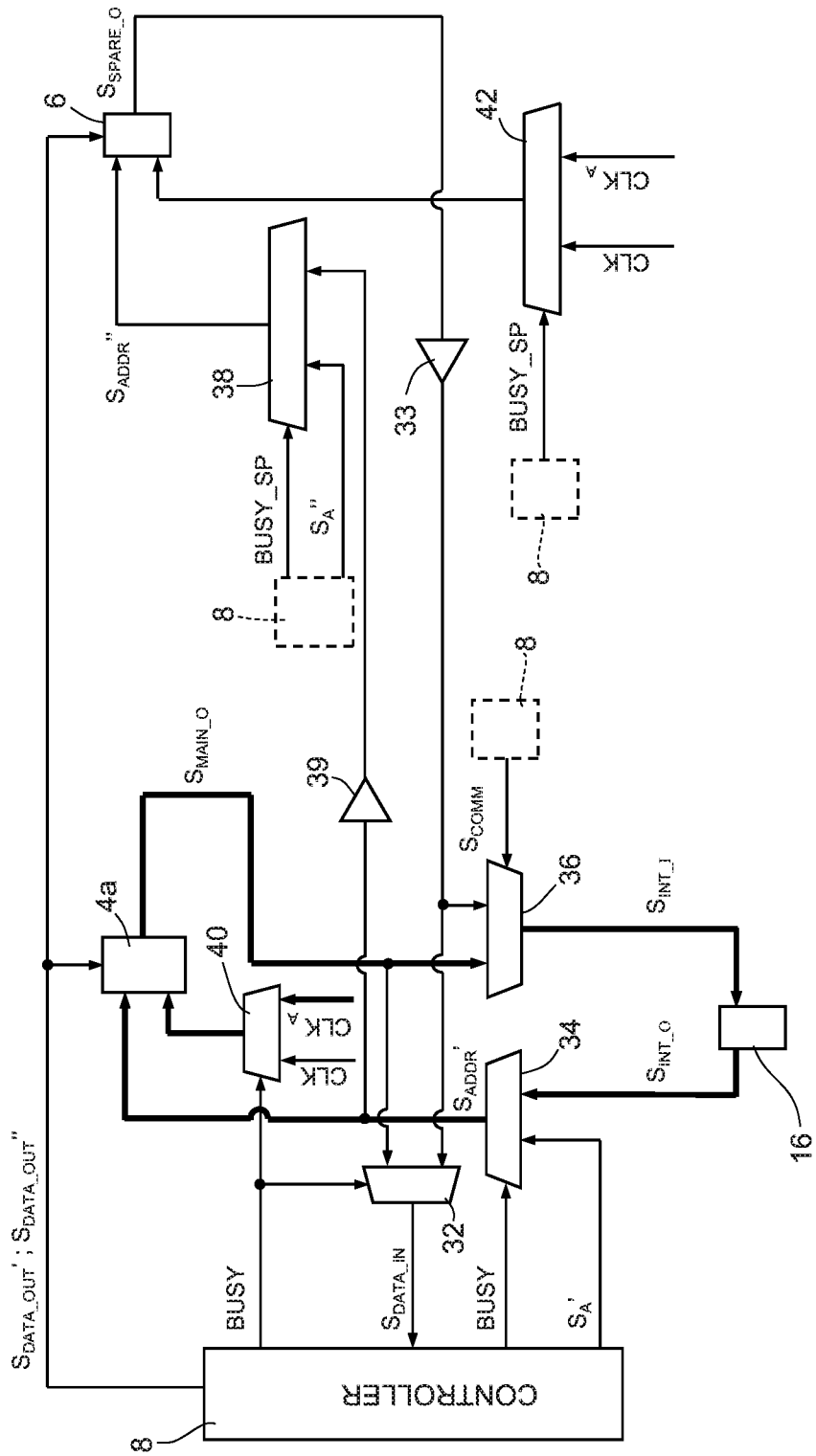

FIG. 4E regards step 30 of the method and illustrates an operation of reading by the user of an information content of the main memory module 4a.

In a time interval that elapses from execution of step 30 up to execution of step 26 of a subsequent iteration of the refresh method of FIG. 2, the controller 8 controls the multiplexers 34, 36, 40 so as to select and supply at output the signals SINT_O, SMAIN_O and CLKA, respectively. In this way, whenever in the time interval the user requests reading of the information content of the main memory module 4a associated to the memory cell addressed by the signal SINT_O, the datum contained in the memory cell of the main memory module 4a addressed by the signal SADDR'=SINT_O is read. This datum, supplied at output by the main memory module 4a via the signal SMAIN_O is thus sent to the memory-array interface 16 via the signal SINT_I.

Figure 5:
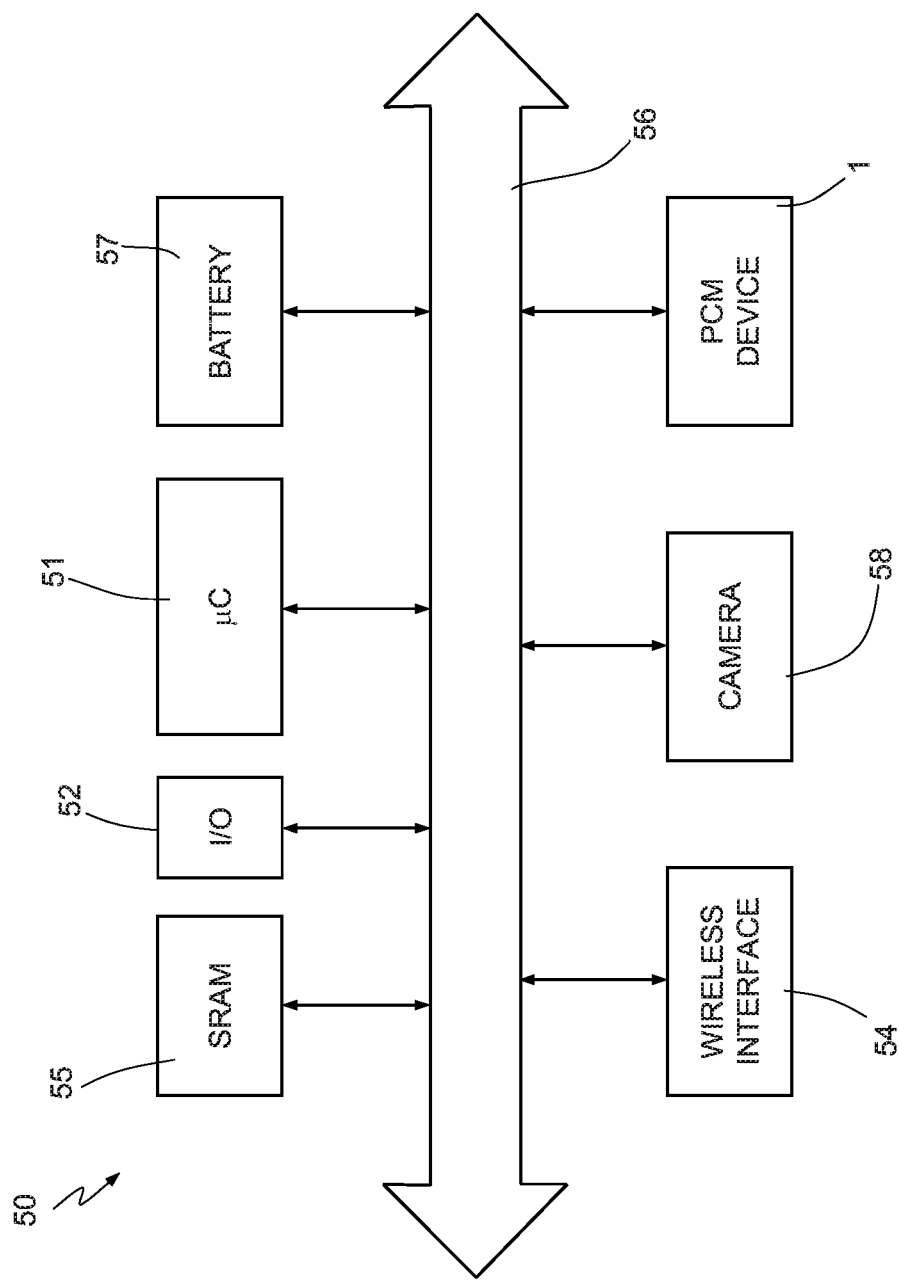
FIG. 5 shows an electronic system that includes the nonvolatile-memory device of FIG. 1

Illustrated in FIG. 5 is a portion of an electronic system 50, according to an embodiment of the present invention. The electronic system 50 may be used in electronic devices, such as: an electronic control unit of a vehicle; a PDA (Personal Digital Assistant); a portable or fixed computer, possibly with capacity of wireless data transfer; a mobile phone; a tablet; a smartphone; a digital audio player; a photographic or video camera; or further devices that are able to process, store, transmit and receive information.

In detail, the electronic system 50 comprises a controller 51 (for example, provided with a microprocessor, a DSP, or a microcontroller) and the nonvolatile-memory device 1 described previously. Optionally, the electronic system 50 comprises one or more from among an input/output device 52 (for example, provided with a keypad and a display), for input and display of data, a wireless interface 54, for example an antenna, for transmitting and receiving data through a radio-frequency wireless-communication network, and a RAM 55, all coupled through a bus 56. A battery 57 may be used as electrical supply source in the electronic system 50, which may further be provided with a photographic or video camera 58.

According to a further embodiment not illustrated in the figures, the nonvolatile-memory device 1 may be embedded in the controller 51.

From an examination of the characteristics of the invention described and illustrated herein, the advantages that it affords are evident.

In particular, implementation of the refresh method of the present invention enables uninterrupted use of a PCM of a differential type in single-ended mode, and consequently storage of different data in memory cells normally coupled for reading a single datum in differential mode.

In this way, it is possible to increase the total capacity of a PCM designed for operating in differential mode, without appreciably increasing the size and costs thereof.

Furthermore, the refresh method is carried out in a way transparent for the user, which has an uninterrupted access in reading and writing to the information content of the entire nonvolatile-memory device, enabling use thereof for real-time applications.

Finally, it is clear that modifications and variations may be made to the disclosure described and illustrated herein, without thereby departing from the scope of the present invention, as defined in the annexed claims.

For instance, the refresh method may be applied to any memory of a differential type, not necessarily based upon phase-change technology.

What is claimed is:

1. A method of operating a memory, the method comprising:
storing a copy of first logic data in an auxiliary memory module of the memory by copying the first logic data stored in a first main memory module of the memory into the auxiliary memory module, wherein the memory further comprises a second main memory module that stores second logic data to be refreshed, and wherein the first main memory module is synchronized to a first clock signal having a first frequency and the second main memory module is synchronized to a second clock signal having a second frequency different from the first frequency;
storing a copy of the second logic data in the auxiliary memory module by copying the second logic data from the second main memory module into the auxiliary memory module;
refreshing the first logic data;
refreshing the second logic data;
receiving a request for reading the first logic data;
when refreshing the first logic data, fetching the copy of the first logic data in response to the request for reading the first logic data;
when not refreshing the first logic data, fetching the first logic data in response to the request for reading the first logic data;
receiving a request for reading the second logic data;
when refreshing the second logic data, fetching the copy of the second logic data in response to the request for reading the second logic data;
when not refreshing the second logic data, fetching the second logic data in response to the request for reading the second logic data;
causing the auxiliary memory module to operate synchronously with the first clock signal during fetching of the second logic data; and
causing the auxiliary memory module to operate synchronously with the second clock signal during fetching of the copy of the second logic data.

2. The method of claim 1, wherein refreshing the first logic data is carried out after storing the copy of the first logic data.

3. The method of claim 1, further comprising, after fetching the first logic data or the copy of the first logic data, supplying the fetched first logic data or copy of the first logic data to a user of the memory.

4. The method of claim 1, wherein refreshing the first logic data comprises reading the first logic data from the first main memory module and rewriting the first logic data into the first main memory module.

5. The method of claim 1, further comprising repeating the steps of storing the copy of the first logic data in the auxiliary memory module and fetching the first logic data or the copy of the first logic data at regular intervals having a duration shorter than a retention time of the first logic data.

6. The method of claim 1, wherein the memory is a phase-change memory.

7. The method of claim 1, wherein the memory is a differential memory.

8. The method of claim 7, wherein the differential memory is used in single-ended mode.

9. A memory comprising:
a first main memory module configured to store first logic data to be refreshed, the first main memory module comprising a clock input configured to receive a first clock signal having a first frequency;
a second main memory module configured to store second logic data to be refreshed, the second main memory module comprising a clock input configured to receive a second clock signal having a second frequency different from the first frequency;
an auxiliary memory module;
a multiplexer having a first input configured to receive the first clock signal, a second input configured to receive the second clock signal, and an output coupled to the auxiliary memory module; and
a controller configured to:
control storage of a copy of the first logic data in the auxiliary memory module by copying the first logic data from the first main memory module into the auxiliary memory module;
control storage of a copy of the second logic data in the auxiliary memory module by copying the second logic data from the second main memory module into the auxiliary memory module:
refresh the first logic data;
refresh the second logic data;
receive a request for reading the first logic data;
when refreshing the first logic data, fetch the copy of the first logic data in response to the request for reading the first logic data;
when not refreshing the first logic data, fetch the first logic data in response to the request for reading the first logic data;
receive a request for reading the second logic data;
when refreshing the second logic data, fetch the copy of the second logic data in response to the request for reading the second logic data; and
when not refreshing the second logic data, fetch the second logic data in response to the request for reading the second logic data.

10. The memory of claim 9, wherein the controller is further configured to refresh the first logic data after storing the copy of the first logic data in the auxiliary memory module.

11. The memory of claim 9, further comprising an interface for input and output of logic data, the controller being further configured to supply the fetched first logic data or copy of the first logic data to the interface.

12. The memory of claim 9, wherein the controller is further configured to refresh the first logic data by reading the first logic data from the first main memory module and rewriting the first logic data into the first main memory module.

13. The memory of claim 9, wherein the controller is further configured to repeat the steps of storing the copy of the first logic data in the auxiliary memory module and fetching the first logic data or the copy of the first logic data at regular intervals having a duration shorter than a retention time of the first logic data.

14. The memory of claim 9, wherein the memory is a phase-change memory.

15. The memory of claim 9, wherein the memory is a differential memory.

16. The memory of claim 9, wherein the controller is further configured to:
control the multiplexer to connect the first input to the output during fetching of the first logic data so that the auxiliary memory module operates synchronously with the first clock signal; and
control the multiplexer to connect the second input to the output during fetching of the copy of the second logic data so that the auxiliary memory module operates synchronously with the second clock signal.

17. The memory of claim 16, wherein the controller is configured to control the multiplexer with a first signal, the memory further comprising a second multiplexer having a first input coupled to the first main memory module, a second input coupled to an output of the auxiliary memory module, and an output coupled to the controller, wherein the controller is configured to select between the first and second inputs of the second multiplexer with a second control signal.

18. The memory of claim 17, further comprising a third multiplexer having a first input configured to receive the first clock signal, a second input configured to receive the second clock signal, and an output coupled to the first main memory module, wherein the controller is configured to control the third multiplexer with the second control signal.

19. An electronic system comprising:
a bus; and
a memory coupled to the bus, the memory comprising:
a first main memory module configured to store first logic data to be refreshed, the first main memory module comprising a clock input configured to receive a first clock signal having a first frequency;
a second main memory module configured to store second logic data to be refreshed, the second main memory module comprising a clock input configured to receive a second clock signal having a second frequency different from the first frequency;
an auxiliary memory module;
a multiplexer having a first input configured to receive the first clock signal, a second input configured to receive the second clock signal, and an output coupled to the auxiliary memory module; and
a controller configured to:
control storage of a copy of the first logic data in the auxiliary memory module by copying the first logic data from the first main memory module into the auxiliary memory module;

control storage of a copy of the second logic data in the auxiliary memory module by copying the second logic data from the second main memory module into the auxiliary memory module;
refresh the first logic data;
refresh the second logic data;
receive a request for reading the first logic data;
when refreshing the first logic data, fetch the copy of the first logic data in response to the request for reading the first logic data;
when not refreshing the first logic data, fetch the first logic data in response to the request for reading the first logic data;
receive a request for reading the second logic data;
when refreshing the second logic data, fetch the copy of the second logic data in response to the request for reading the second logic data; and
when not refreshing the second logic data, fetch the second logic data in response to the request for reading the second logic data.

20. The electronic system of claim 19, wherein the system comprises an electronic control unit of a vehicle, a personal digital assistant (PDA), a notebook, a mobile phone, a smartphone, a tablet, a digital audio player, a photographic camera or a video camera.

21. The electronic system of claim 19, wherein the memory is a differential memory.

\* \* \* \* \*